United States Patent
Somani et al.

(10) Patent No.: US 12,146,922 B2
(45) Date of Patent: Nov. 19, 2024

(54) SYSTEM AND METHOD FOR INPUT POWER DETECTION OF TWO POWER SOURCES USING SINGLE MONITORING CIRCUIT

(71) Applicant: Hamilton Sundstrand Corporation, Charlotte, NC (US)

(72) Inventors: Vaibhav Kumar Somani, Karnataka (IN); Alagan Thiruvarul Selvakkumaran Sathyan, Tamilnadu (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 219 days.

(21) Appl. No.: 17/720,406

(22) Filed: Apr. 14, 2022

(65) Prior Publication Data

US 2023/0251326 A1    Aug. 10, 2023

(30) Foreign Application Priority Data

Feb. 9, 2022   (IN) .............................. 202211006908

(51) Int. Cl.
  *G01R 31/40*  (2020.01)
  *G01R 31/28*  (2006.01)
  *H02J 9/06*   (2006.01)

(52) U.S. Cl.
  CPC ......... *G01R 31/40* (2013.01); *G01R 31/2827* (2013.01); *H02J 9/06* (2013.01)

(58) Field of Classification Search
  CPC ........ G01R 31/40; G01R 31/2827; H02J 9/06
  USPC ....................................... 324/108, 500, 713
  See application file for complete search history.

(56) References Cited

U.S. PATENT DOCUMENTS

| | | | |
|---|---|---|---|
| 5,386,147 A | 1/1995 | Bonneau et al. | |
| 5,894,413 A | 4/1999 | Ferguson | |
| 7,868,637 B2 | 1/2011 | Avritch et al. | |
| 10,790,739 B1 | 9/2020 | Villano et al. | |
| 11,011,908 B2 * | 5/2021 | Hopkins | H02J 1/109 |
| 2008/0164759 A1 | 7/2008 | Sharma et al. | |

FOREIGN PATENT DOCUMENTS

JP    2020150639 A    9/2020

OTHER PUBLICATIONS

European Search Report for Application No. 23155430.4, mailed May 26, 2023, 9 pages.
Machine Translation for JP2020150639A, Published Sep. 17, 2020, 14 pages.

(Continued)

*Primary Examiner* — Vincent Q Nguyen
(74) *Attorney, Agent, or Firm* — CANTOR COLBURN LLP

(57) ABSTRACT

A voltage supply system that includes a first power supply branch and a second power supply branch. Both branches includes a voltage supply; a serially connected diode and switch connected between the voltage supply and an output of the voltage supply system; and a gate driver connected to the first switch to control operation of the switch. The system also includes a voltage monitor/controller configured to perform a built-in test of the system by controlling the state of the first and second switches by controlling enable signals provided to the first and second gate drivers.

16 Claims, 2 Drawing Sheets

(56) References Cited

OTHER PUBLICATIONS

Martin Patoka: "Fundamentals of Power System ORing", Mar. 21, 2007, Retrieved from the Internet: URL: https://www.edn.com/fundamentals-of-power-system-oring/ [retrieved on May 10, 2023], 13 pages.

* cited by examiner

SYSTEM AND METHOD FOR INPUT POWER DETECTION OF TWO POWER SOURCES USING SINGLE MONITORING CIRCUIT

CROSS-REFERENCE TO RELATED APPLICATIONS

This application claims priority to Indian Patent Application No. 202211006908 filed Feb. 9, 2022, the entire contents of which is incorporated herein by reference.

BACKGROUND

Exemplary embodiments of the present disclosure pertain to the art of supplying power and, in particular, to testing two or more redundant power sources with a single circuit.

A number of applications, such as safety critical avionics, make use of independent, redundant power input sources. In the event that one or more of the input sources fails, another of the available redundant power input sources is employed to ensure an uninterrupted supply of power.

In such systems, the two input voltages are typically connected in "OR" using diodes. To ensure that both input voltage are working, the input voltage of sources usually separately measured at input point (before the diode). That is, in prior art systems, voltage monitoring of two sources is done using two different voltage monitoring circuits.

BRIEF DESCRIPTION

Disclosed is a voltage supply system that includes: a first power supply branch and a second power supply branch. The first power supply branch includes: a first voltage supply; a serially connected first diode and first switch connected between the first voltage supply and an output of the voltage supply system; and a first gate driver connected to the first switch to control operation of the first switch. The second power supply branch includes: a second voltage supply; a serially connected second diode and second switch connected between the second voltage supply and the output of the voltage supply system; and a second gate driver connected to the second switch to control operation of the first switch. The system also includes a voltage monitor/controller configured to perform a built-in test of the system by controlling the state of the first and second switches by controlling enable signals provided to the first and second gate drivers.

In addition to one or more of the features described above, or as an alternative to any of the foregoing embodiments, the gate drivers can receive power from their respective power supplies.

In addition to one or more of the features described above, or as an alternative to any of the foregoing embodiments, the first gate driver includes a first enable input (EN1) and the second gate driver includes a second enable input (EN2), wherein the first gate driver causes the first switch to conduct when it receives a signal at EN1 and the second gate driver causes the second switch to conduct when it receives a signal at EN2.

In addition to one or more of the features described above, or as an alternative to any of the foregoing embodiments, the voltage monitor controller includes logic that controls the built in test.

In addition to one or more of the features described above, or as an alternative to any of the foregoing embodiments, the logic causes the system to operate in a first state where both the first and second gate drives are enabled to cause both the first and second switches to be conductive.

In addition to one or more of the features described above, or as an alternative to any of the foregoing embodiments, the logic determines that neither of the first and second voltage sources are operational when the voltage monitor measures a voltage below an expected voltage while the system is in the first state.

In addition to one or more of the features described above, or as an alternative to any of the foregoing embodiments, the logic determines that at least one of the first and second voltage sources are operational when the voltage monitor measures an expected voltage while the system is in the first state.

In addition to one or more of the features described above, or as an alternative to any of the foregoing embodiments, when the logic determines that at least one of the first and second voltage sources are operational, the logic cycles to a second state where the first gate driver is enabled and the first switch is conductive and the second gate driver is disabled.

In addition to one or more of the features described above, or as an alternative to any of the foregoing embodiments, the logic determines that the first voltage source has failed and returns the system to the first state if the voltage monitor measures a value that falls below an expected value.

In addition to one or more of the features described above, or as an alternative to any of the foregoing embodiments, the logic determines that the first voltage source is operational when the voltage monitor measures an expected voltage while the system is in the second state and then cycles into a third state wherein the first gate driver is disable, the second gate driver is enabled and the second switch is conductive.

In addition to one or more of the features described above, or as an alternative to any of the foregoing embodiments, the logic determines that the second voltage source has failed and returns the system to the first or second state if the voltage monitor measures a value that falls below an expected value.

Also disclosed is method of testing a voltage supply system with a single circuit. The method includes: providing a system as claimed in claim 1, wherein the first gate driver includes a first enable input (EN1) and the second gate driver includes a second enable input (EN2), wherein the first gate driver causes the first switch to conduct when it receives a signal at EN1 and the second gate driver causes the second switch to conduct when it receives a signal at EN2; causing the system to operate in a first state where both the first and second gate drives are enabled to cause both the first and second switches to be conductive; and measuring a voltage at an output of the system with the voltage monitor.

In addition to one or more of the features described above, or as an alternative to any of the foregoing embodiments, the method can also include determining that neither of the first and second voltage sources are operational when the voltage monitor measures a voltage below an expected voltage while the system is in the first state.

In addition to one or more of the features described above, or as an alternative to any of the foregoing embodiments, the method can also include determining that at least one of the first and second voltage sources are operational when the voltage monitor measures an expected voltage while the system is in the first state.

In addition to one or more of the features described above, or as an alternative to any of the foregoing embodiments, in the method, when at least one of the first and second voltage sources are operational, switching the circuit to a second state where the first gate driver is enabled and the first switch is conductive and the second gate driver is disabled.

In addition to one or more of the features described above, or as an alternative to any of the foregoing embodiments, the method can also include determining that the first voltage source has failed and returns the system to the first state if the voltage monitor measures a value that falls below an expected value.

In addition to one or more of the features described above, or as an alternative to any of the foregoing embodiments, the method can also include: determining that the first voltage source is operational when the voltage monitor measures an expected voltage while the system is in the second state; and cycling into a third state wherein the first gate driver is disable, the second gate driver is enabled and the second switch is conductive.

In addition to one or more of the features described above, or as an alternative to any of the foregoing embodiments, the method can also include determining that the second voltage source has failed and returning the system to the first or second state if the voltage monitor measures a value that falls below an expected value.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

As discussed above, it is common for the two input voltages to be connected in an "OR" configuration using diodes. To ensure that both input voltage are working, the status of each voltage source is typically measured with its own voltage monitor. That is, voltage monitoring of two sources is done using two different voltage monitoring circuit.

Embodiments herein disclose a system which can detect the two different voltage sources with a single monitoring circuit. This can be done without interrupting the input power to the drive device (assuming at least one of the sources is operational).

Figure 1:
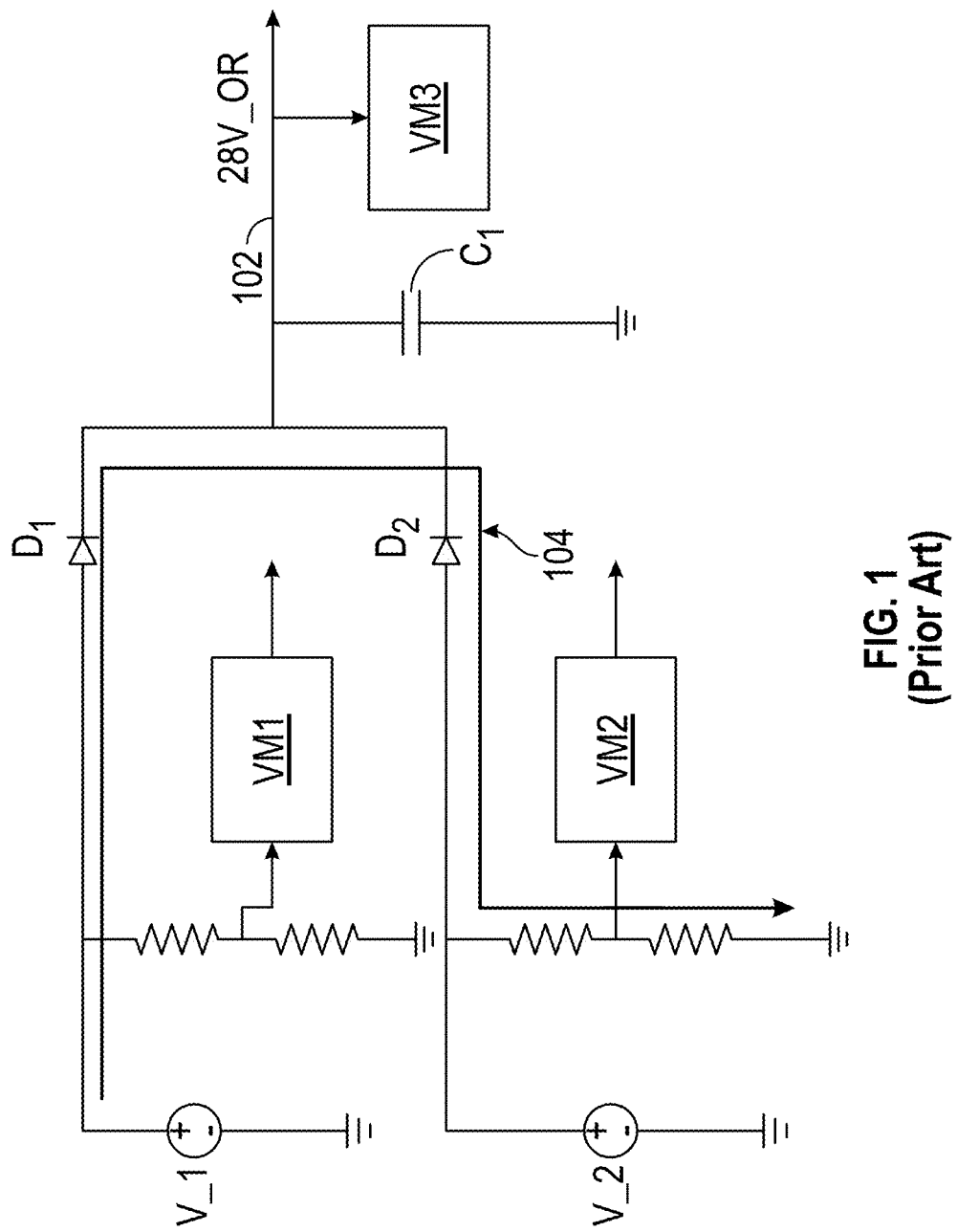
FIG. 1 is an example of a prior art OR connection of two power sources supplying power to an output.

FIG. 1 shows a prior art system 100 that has two sources V_1/V_2 connected in a so-called "OR" configuration. The diodes D1 and D2 provide a configuration that allows either or both of V_1/V_2 to drive the output line 102. Also included is an output capacitor C1 to smooth the output at start up and in the event one of the sources fails. Other circuit elements are self-explanatory to the skilled artisan based on FIG. 1. For completeness, it is noted that an output voltage monitor VM3 can also be provided that measures the voltage output.

To ensure that each voltage source V_1/V_2 is operating properly, each voltage source is connected to a separate, respective, voltage input monitor VM1 and VM2. Having separate monitor for each voltage source V_1/V_2 can increase cost and complexity. Further, as shown by leakage path 104, in some instances diode leakage current can lead to an erroneous indication that V_2 is operational even if it has failed. Of course, the opposite leakage path could also present a V_1 error.

In addition to the abovementioned single circuit operation, embodiments herein may avoid the above-described operational error due to leakage current.

In the above and the below, V_1/V_2 can be provided by, for example, rectified generator voltages, batteries or both (e.g., V_1 can be rectified power from an AC supply and V_2 can be a battery).

Figure 2:
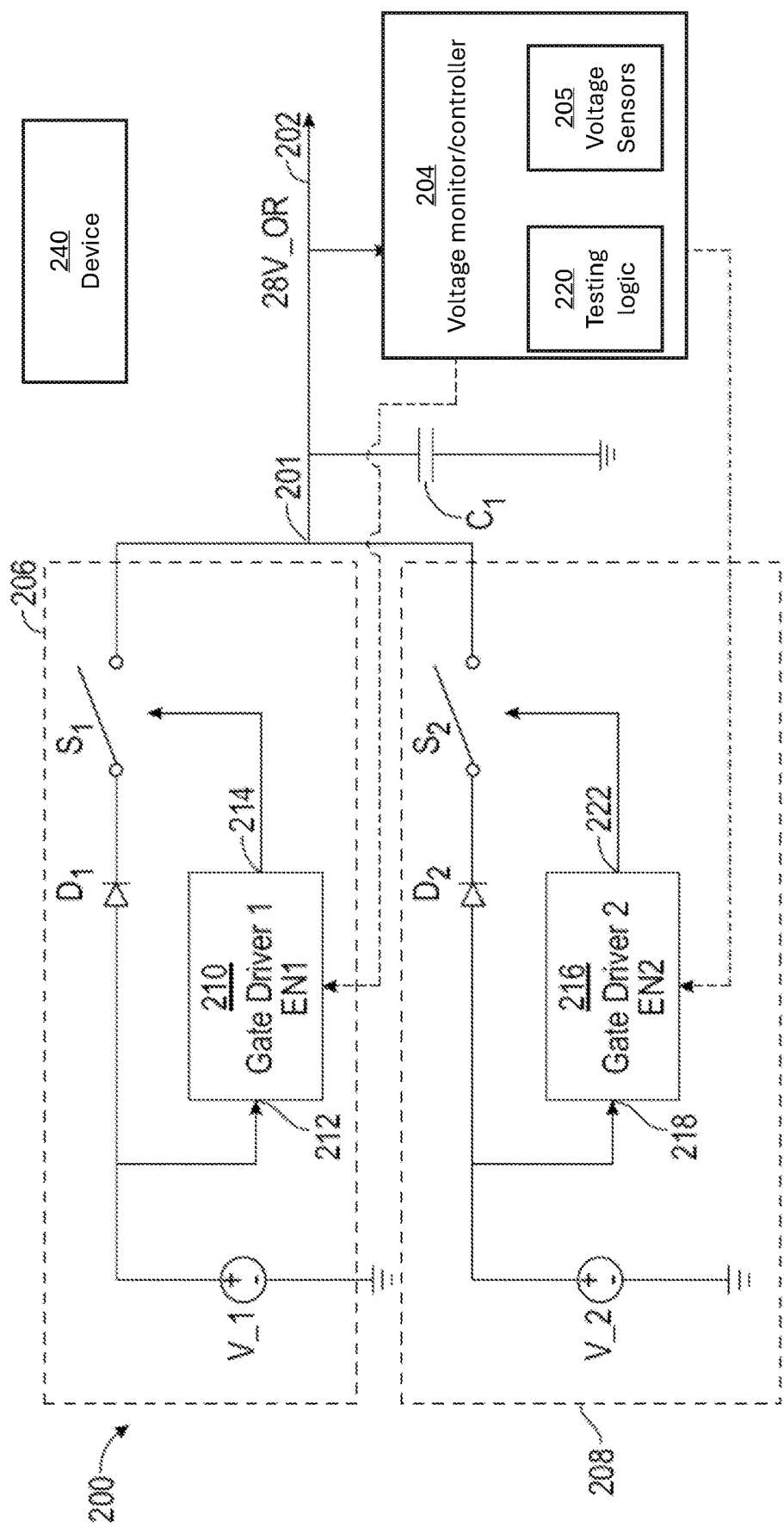
FIG. 2 is simplified circuit diagram of an OR connection of two power sources supplying power to an output including the testing circuitry according one or more embodiments.

FIG. 2 shows a simplified circuit 200 that can test two "OR" connected voltage sources V_1/V_2. The circuit 200 includes two series connected flow control devices connected to the output of each voltage source V1/V2. As illustrated, the combination is formed by a series combination of a diode and a switch. Of course, other combinations could be use such as two switches and, in particular, complementary switches. The output of the respective switches can be connected together for each voltage source resulting in "OR" connected dual power supply system. The point of connection is generally shown as ORing point 201. It shall be understood that other circuit elements can be connected between the outputs of the switches and the ORing point 201 that is also connected to the output 202 of the circuit 200. The voltage at the ORing point 201/output 202 can be monitored by a voltage monitor/controller 204 that measures voltages at the ORing point 201 and controls the status of the switches. The voltage monitor/controller 204 can be single monitor in one embodiment.

As will be understood, having the combination of a diode and a switch helps to stop the flaw of leakage current from one source to another to overcome at least one the above discussed possible shortcomings of the prior art.

As illustrated, the circuit 200 includes first and second power supply branches 206, 208. Both have outputs connected to the ORing point 201 and, as will be understood by the skilled artisan, can either alone or combination drive the output 202. The output 202/ORing point 201 can be coupled to ground via an output capacitor C1.

The first power supply branch 206 includes the first power supply V_1. V_1 connected to the output 202 via a series connection of a first diode D1 and first switch S1. The first power supply branch 206 also includes a first gate driver 210. The gate driver controls the status of the first switch S1 and includes an input 212, an output 214, and an enable EN1. The output 214 of the gate driver 210 is connected to the first switch S1 and controls its condition/state (e.g., open or closed). In normal operation, the first gate driver 210 places the first switch S1 into a conductive or closed condition so that power from the first power supply V_1 can pass through the first diode D1 and the first switch S1 to reach the ORing point 201.

As shown, the circuit 200 includes the voltage monitor/controller 204. The voltage monitor/controller 204 is connected to enable EN1. This connection will allow for testing as discussed below.

The input 212 of the first gate driver 210 is connected to the first power supply V_1. When enabled by EN1 the first gate driver 210 uses input power from V_1 and enables the first switch S1. Of course, the first gate driver could be provided power from a different source.

The second power supply branch 208 includes the second power supply V_2. V_2 connected to the output 202 via a series connection of a second diode D2 and second switch S2. The second power supply branch 208 also includes a second gate driver 216. The second gate driver 216 controls the status of the second switch S2 and includes an input 218, an output 222, and an enable EN2. The output 222 of the second gate driver 216 is connected to the second switch S2 and controls its condition/state (e.g., open or closed). In normal operation, the second gate driver 216 places the second switch S2 into a conductive or closed condition so that power from the second power supply V_2 can pass through the first diode D1 and the first switch S1 to reach the ORing point 201.

Similar to the above, the voltage monitor/controller 204 is connected to enable EN2 of the second gate driver 216. This connection will allow for testing as discussed below. As shown, the input 218 of the second gate driver 216 is connected to the second power supply V_2. When enabled by EN2 the second gate driver 216 uses input power from V_2 and enables the second switch S2. Of course, the second gate driver could be provided power from a different source. Thus, the first and second gate drivers can share a separate power supply or have their own as alternatives to what is shown in the FIG. 2.

As noted above, the first and second gate drivers 210, 216 are connected to and receive power from their respective power sources V-1, V_2. Thus, if the power sources are not providing power, the gate driver cannot cause its associated switch (S1/S2) to close regardless of the value of the associated enable signal.

The voltage monitor 204 can include testing logic 220 that can allow the monitor 204 to determine the status of each power supply V_1/V_2 with a single monitor. This is done, for example, by controlling the signals provided to EN1/EN2 and measuring the voltage at the output 202. It shall be understood that because controlling EN1/EN2 can open switches S1/S2, the first and second power supply branches 206, 208 can essentially be isolated from one another so error due to leakage current can be reduced or eliminated.

Reference is now made to FIG. 2 and Table 1 below. In one embodiment, the testing logic 220 of the voltage monitor/controller 204 can be programmed so that it can perform a built in test (BIT) to determine if the status of each power supply V_1/V_2. In particular, the testing logic can follow control the signals provided to EN1 and EN2. An example of such a sequence and related observations is shown in Table 1 below. It shall be understood that different sequences could be utilized.

TABLE 1

BIT test and observation of input voltage source availability

| | BIT | | Reading at OR | |
|---|---|---|---|---|
| | En1 | En2 | point 201 | Conclusion |
| State 0 | 0 | 0 | | Initial Condition |
| State 1 | 1 | 1 | Power Available | Either VM1 or VM2 or both is present |
| | | | Power not Available | Both sources are not available |
| State 2 | 1 | 0 | Power Available | VM1 is available and measurement on ORing point shows voltage level of 1st source |
| | | | Power decaying towards zero | VM1 is not available. Switch back to state 1 as soon as voltage is below critical level (e.g., 16 V) |
| State 3 | 0 | 1 | Power Available | VM2 is available and |

TABLE 1-continued

BIT test and observation of input voltage source availability

| | BIT | | Reading at OR | |
|---|---|---|---|---|
| | En1 | En2 | point 201 | Conclusion |
| | | | | measurement on ORing point 201 shows voltage level of VM2 |
| | | | Power decaying towards zero | VM2 is not available. Switch back to state 1 as soon as voltage is below critical level (16 V) |

As shown, the BIT sequence and observation result from each state is listed in Table 1. Initial state is 'state 0' in which EN1=0 and EN2=0. The next state is state 1. In 'state 1' both switches S1 & S2 are enabled by making EN1=1 and EN2=1. At this state there are two possibilities at ORing point 201. If an expected voltage (e.g., 28V) is available then either or both input sources V_1/V_2 are available. If there is voltage, then neither voltage source V_1/V_2 is available. In such a case, a failure of both can be noted and the BIT can cease.

To check the individual source availability, the logic 220 cycles to the next state (state 2). In this state, switches S1 is kept ON and switch S2 is turned OFF by making EN1=1 and EN2=0. If the expected is available at ORing point 201, then it is known that V_1 is functioning correctly as it is the only one providing power point 201 in this configuration. If V_1 is failed, then the voltage at point 201 will start to fall towards zero then it indicates that source V_1 is not available and voltage at 28V_OR should be monitored. As soon as voltage go below a critical lower limit (e.g., 16V), system should go back to state 1 which will ensure the power is not interrupted at 28V_OR point. The voltage drop is not instantaneous due to C1. This can allow for testing without interruption of the power to the output 202.

In 'state 3' switch S1 is turned OFF and switch S2 is turned ON by making EN1=0 and EN2=1. If a desired voltage (e.g., 28 V) is available at point 201 then availability of V_2 is guaranteed and reading of voltage level is assigned to voltage level of source V_2. If, however, the voltage starts falling towards zero then it indicates that V_2 is not available. As above, in the event that voltage falls below a critical lower limit the system goes back to state 1 which will ensure the power is not interrupted at point 201. State 1 can be referred to as a normal operational state herein.

It shall be understood that while the above table has the system cycle back to a state 1, there could be instances where it cycles to either state 2 or 3 depending on which voltage source has failed without departing from the teachings herein.

It should be further noted that the results of any test performed can be conveyed to another device 240. In one embodiment, the device 240 is a computer in an aircraft. The device can note the status of the voltages sources and create, if needed, a service request or take other remedial actions.

The circuit shown herein two input power sources using a single monitoring circuit, while the prior arts having two monitoring circuits. Further, occurrence of false indications due to leakage current can be eliminated. Also, the monitoring circuit also makes it possible to only one or both of the power sources V_1, V_2 periodically to alternatively utilize power from both sources or to use it from both at the same time. Using both at the same time can be useful in improving thermal management of overall system by sharing power from both sources.

It should be understood that the monitor/controller 204 can include various sensors (e.g., voltage sensors 205). The controller 204 can be formed as a processes that is a hardware device for executing software, particularly that stored in storage, such as cache storage, or memory. The processor can be any custom made or commercially available processor, a central processing unit (CPU), an auxiliary processor among several processors associated with the controller, a semiconductor based microprocessor (in the form of a microchip or chip set), a microprocessor, or generally any device for executing instructions stored in logic 220. The logic 220 can also either access memory of the controller or have its own memory. Regardless it can be configured to either on command or automatically/periodically perform a self test of the power sources V_1, V_2.

The memory can include any one or combination of volatile memory elements (e.g., random access memory (RAM, such as DRAM, SRAM, SDRAM, etc.)) and non-volatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory may incorporate electronic, magnetic, optical, and/or other types of storage media. Note that the memory can have a distributed architecture, where various components are situated remote from one another, but can be accessed by the processor.

The instructions in logic 220 may include one or more separate programs, each of which comprises an ordered listing of executable instructions for implementing logical functions as described above.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A voltage supply system comprising:
   a first power supply branch that includes:
   a first voltage supply;
   a serially connected first diode and first switch connected between the first voltage supply and an output of the voltage supply system; and
   a first gate driver connected to the first switch to control operation of the first switch;
   a second power supply branch that includes:
   a second voltage supply;
   a serially connected second diode and second switch connected between the second voltage supply and the output of the voltage supply system; and
   a second gate driver connected to the second switch to control operation of the first switch; and
   a voltage monitor/controller configured to perform a built-in test of the system by controlling the state of the first and second switches by controlling enable signals provided to the first and second gate drivers;
   wherein the gate drivers receive power from their respective power supplies; and
   wherein the first gate driver includes a first enable input (EN1) and the second gate driver includes a second enable input (EN2), wherein the first gate driver causes the first switch to conduct when it receives a signal at EN1 and the second gate driver causes the second switch to conduct when it receives a signal at EN2.

2. The system of claim 1, wherein the voltage monitor controller includes logic that controls the built in test.

3. The system of claim 2, wherein the logic causes the system to operate in a first state where both the first and second gate drives are enabled to cause both the first and second switches to be conductive.

4. The system of claim 3, wherein the logic determines that neither of the first and second voltage sources are operational when the voltage monitor measures a voltage below an expected voltage while the system is in the first state.

5. The system of claim 3, wherein the logic determines that at least one of the first and second voltage sources are operational when the voltage monitor measures an expected voltage while the system is in the first state.

6. The system of claim 5, wherein when the logic determines that at least one of the first and second voltage sources are operational, the logic cycles to a second state where the first gate driver is enabled and the first switch is conductive and the second gate driver is disabled.

7. The system of claim 6, wherein the logic determines that the first voltage source has failed and returns the system to the first state if the voltage monitor measures a value that falls below an expected value.

8. The system of claim 7, wherein the logic determines that the first voltage source is operational when the voltage monitor measures an expected voltage while the system is in the second state and then cycles into a third state wherein the first gate driver is disable, the second gate driver is enabled and the second switch is conductive.

9. The system of claim 8, wherein the logic determines that the second voltage source has failed and returns the system to the first or second state if the voltage monitor measures a value that falls below an expected value.

10. A method of testing a voltage supply system with a single circuit, the method comprising:
    providing a system as claimed in claim 1;
    causing the system to operate in a first state where both the first and second gate drives are enabled to cause both the first and second switches to be conductive; and
    measuring a voltage at an output of the system with the voltage monitor.

11. The method of claim 10, further comprising:
determining that neither of the first and second voltage sources are operational when the voltage monitor measures a voltage below an expected voltage while the system is in the first state.

12. The method of claim 10, further comprising:
determining that at least one of the first and second voltage sources are operational when the voltage monitor measures an expected voltage while the system is in the first state.

13. The method of claim 12, wherein, when at least one of the first and second voltage sources are operational, switching the circuit to a second state where the first gate driver is enabled and the first switch is conductive and the second gate driver is disabled.

14. The method of claim 13, further comprising:
determining that the first voltage source has failed and returns the system to the first state if the voltage monitor measures a value that falls below an expected value.

15. The method of claim 13, further comprising:
determining that the first voltage source is operational when the voltage monitor measures an expected voltage while the system is in the second state; and
cycling into a third state wherein the first gate driver is disable, the second gate driver is enabled and the second switch is conductive.

16. The method of claim 15, further comprising:
determining that the second voltage source has failed and returning the system to the first or second state if the voltage monitor measures a value that falls below an expected value.

* * * * *